(12) United States Patent
Kuribara

(10) Patent No.: US 11,138,070 B2
(45) Date of Patent: Oct. 5, 2021

(54) MEMORY SYSTEM AND METHOD PERFORMED THEREBY

(71) Applicant: KIOXIA CORPORATION, Tokyo (JP)

(72) Inventor: Makoto Kuribara, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/799,326

(22) Filed: Feb. 24, 2020

(65) Prior Publication Data

US 2021/0089391 A1 Mar. 25, 2021

(30) Foreign Application Priority Data

Sep. 19, 2019 (JP) .............................. JP2019-170738

(51) Int. Cl.
*G06F 11/10* (2006.01)
*G11C 16/26* (2006.01)
*G11C 16/04* (2006.01)
*H03M 13/15* (2006.01)

(52) U.S. Cl.
CPC ...... *G06F 11/1068* (2013.01); *G11C 16/0483* (2013.01); *G11C 16/26* (2013.01); *H03M 13/1515* (2013.01)

(58) Field of Classification Search
CPC . G06F 11/1068; G11C 16/0483; G11C 16/26; H03M 13/1515
See application file for complete search history.

(56) References Cited

U.S. PATENT DOCUMENTS

| 7,882,421 | B2 | 2/2011 | Oguz et al. |
| 8,522,109 | B2 | 8/2013 | Murakami et al. |
| 9,524,790 | B1* | 12/2016 | Steiner .................. G11C 16/28 |
| 2003/0149929 | A1* | 8/2003 | White .................. G11C 11/406 714/766 |
| 2009/0150595 | A1* | 6/2009 | Lavan ................ G11C 16/0475 711/103 |
| 2013/0197875 | A1* | 8/2013 | Shirley ............ G01R 31/31718 703/2 |
| 2016/0098216 | A1* | 4/2016 | Huang ................ G06F 11/1072 714/37 |
| 2016/0322113 | A1* | 11/2016 | Parker .................. G11C 16/349 |
| 2017/0102994 | A1* | 4/2017 | Lien ........................ G11C 29/12 |
| 2018/0323914 | A1 | 11/2018 | Wesel et al. |

* cited by examiner

*Primary Examiner* — Guy J Lamarre
(74) *Attorney, Agent, or Firm* — Kim & Stewart LLP

(57) ABSTRACT

According to one embodiment, a memory system includes a non-volatile semiconductor memory having a plurality of blocks each including a plurality of memory cells, and a memory controller configured to calculate a bit error rate when reading data from a block of the blocks and obtain an equation representing temporal changes in the bit error rate for the block, and based on the obtained equation, determine, for the block, a timing for performing a next refresh operation by which data that have been written to the block are rewritten.

16 Claims, 14 Drawing Sheets

FIG. 9

| NAND TEMPERATURE | NUMBER OF TIMES OF W/E | | | | | | | | | |
|---|---|---|---|---|---|---|---|---|---|---|
| | 0k~(1k) | 1k~(2k) | 2k~(3k) | 3k~(4k) | 4k~(5k) | 5k~(6k) | 6k~(7k) | 7k~(8k) | 8k~(9k) | 9k~(10k) |
| (75) OR HIGHER | 4480 | 4800 | 6080 | 5440 | 5760 | 6080 | 6400 | 6720 | 7040 | 7360 |
| (70)~75°C | 3360 | 3600 | 4560 | 4080 | 4320 | 4560 | 4800 | 5040 | 5280 | 5520 |
| (65)~70°C | 2240 | 2400 | 3040 | 2720 | 2880 | 3040 | 3200 | 3360 | 3520 | 3680 |
| (60)~65°C | 1120 | 1200 | 1520 | 1360 | 1440 | 1520 | 1600 | 1680 | 1760 | 1840 |
| (55)~60°C | 560 | 600 | 760 | 680 | 720 | 760 | 800 | 840 | 880 | 920 |
| (50)~55°C | 280 | 300 | 360 | 340 | 360 | 380 | 400 | 420 | 440 | 460 |
| (45)~50°C | 140 | 150 | 160 | 170 | 180 | 190 | 200 | 210 | 220 | 230 |
| (40)~45°C | 130 | 140 | 150 | 160 | 170 | 180 | 190 | 200 | 210 | 220 |
| (35)~40°C | 120 | 130 | 140 | 150 | 160 | 170 | 180 | 190 | 200 | 210 |
| (30)~35°C | 110 | 120 | 130 | 140 | 150 | 160 | 170 | 180 | 190 | 200 |
| (25)~30°C | 100 | 110 | 120 | 130 | 140 | 150 | 160 | 170 | 180 | 190 |
| (20)~25°C | 100 | 110 | 120 | 130 | 140 | 150 | 160 | 170 | 180 | 190 |
| (15)~20°C | 100 | 110 | 120 | 130 | 140 | 150 | 160 | 170 | 180 | 190 |
| (10)~15°C | 100 | 110 | 120 | 130 | 140 | 150 | 160 | 170 | 180 | 190 |
| (5)~10°C | 100 | 110 | 120 | 130 | 140 | 150 | 160 | 170 | 180 | 190 |
| (0)~5°C | 100 | 110 | 120 | 130 | 140 | 150 | 160 | 170 | 180 | 190 |
| 0°C OR LOWER | 100 | 110 | 120 | 130 | 140 | 150 | 160 | 170 | 180 | 190 |

FIG. 10

| CODING RATE TYPE/BB | C24 | C23 | C22 | C21 | C20 | C19 | C18 | BB |
|---|---|---|---|---|---|---|---|---|
| ERROR BIT THRESHOLD | 54 | 72 | 90 | 108 | 126 | 144 | 162 | 162~ |
| NUMBER OF CORRECTABLE ERROR BITS/FRAME | 60 | 80 | 100 | 120 | 140 | 160 | 180 | — |

FIG. 18

| ATTRIBUTION | PARAMETER | | CONTENTS |
|---|---|---|---|
| Block addr | Blk0 | Blk1 | BLOCK NUMBER |
| Refresh info | Ref Thresh | RDP_cur | THRESHOLD VALUE OF REFRESH OPERATION AND CURRENT VALUE OF RDP |
| Regression equation | a, b | | COEFFICIENT OF REGRESSION EQUATION |
| Code Rate | CR_cur | CR_next | CURRENT VALUE AND NEXT VALUE OF CODING RATE |
| Sample Data | FBC-1 | RDP-1 | VALUES OF FBC AND RDP |
| Sample Data | FBC-2 | RDP-2 | VALUES OF FBC AND RDP |
| ... | ... | ... | ... |

MEMORY SYSTEM AND METHOD PERFORMED THEREBY

CROSS-REFERENCE TO RELATED APPLICATION(S)

This application is based upon and claims the benefit of priority from Japanese Patent Application No. 2019-170738, filed Sep. 19, 2019, the entire contents of which are incorporated herein by reference.

FIELD

Embodiments described herein relate generally to a memory system and a method performed thereby.

BACKGROUND

In a memory system using a non-volatile semiconductor memory, such as a NAND flash memory, memory cells are physically worn by repeatedly writing and erasing data. As a result, the probability that a read error will occur is increased. In order to cope with such a read error, an error correction code is added to written data in advance, and at the time of reading, an error is corrected using the error correction code to restore correct data. When a variable length code is used as an error correction code, if a coding rate is reduced (that is, the code is lengthened), the error correction performance increases, but there is a trade-off relationship between the coding rate and storage capacity or processing speed.

In addition, refresh operation is also performed at a certain timing. The refresh process includes processes of performing error correction on the read data and writing to another block in unit of block.

However, a relationship between the error correction performance set at a physical location of the non-volatile semiconductor memory and the timing of the refresh operation may not be appropriate.

DESCRIPTION OF THE DRAWINGS

FIG. 9 is a diagram illustrating an addition value table in the embodiment;

FIG. 10 is a table illustrating a correction capability of variable length codes in the embodiment;

FIG. 18 is a table illustrating parameters used in the memory system according to the embodiment.

DETAILED DESCRIPTION

Embodiments provide a memory system and a method capable of determining an appropriate timing of refresh operation with respect to the set error correction performance.

In general, according to one embodiment, a memory system includes a non-volatile semiconductor memory having a plurality of blocks each including a plurality of memory cells, and a memory controller configured to calculate a bit error rate when reading data from a block of the blocks and obtain an equation representing temporal changes in the bit error rate for the block, and based on the obtained equation, determine, for the block, a timing for performing a next refresh operation by which data that have been written to the block are rewritten.

Hereinafter, a memory system and a method according to embodiments will be described in detail with reference to the accompanying drawings. In addition, the present disclosure is not limited by the embodiments.

Figure 1:
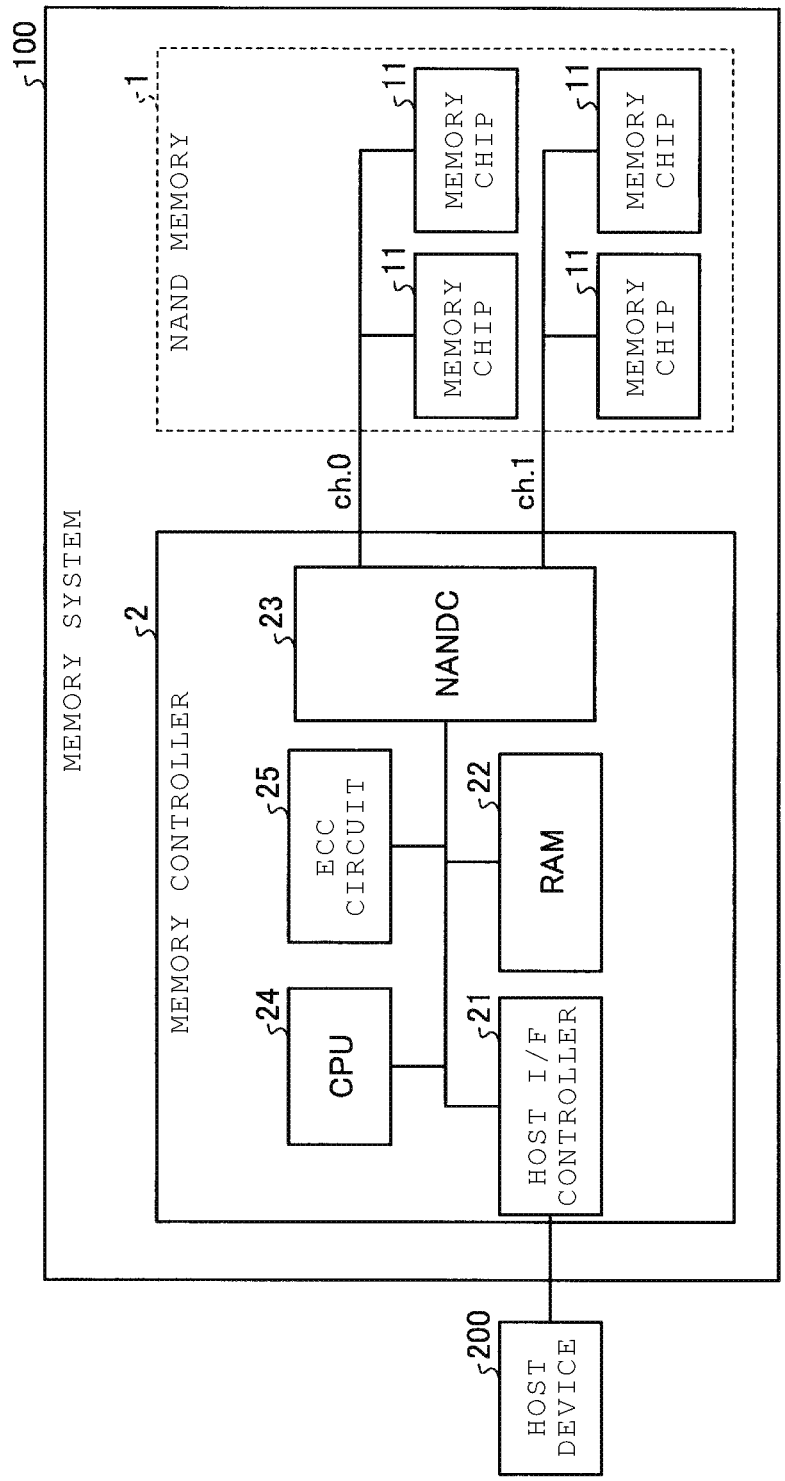
FIG. 1 is a diagram illustrating a configuration of a memory system according to an embodiment.

FIG. 1 is a diagram illustrating a configuration of a memory system 100 according to an embodiment. The memory system 100 is connected to a host device 200. The host device 200 is, for example, a server, a personal computer, a mobile information processing device, or the like. The memory system 100 functions as an external storage device of the host device 200. The host device 200 can issue access requests (e.g., read requests and write requests) to the memory system 100. A standard to which a communication interface that connects the memory system 100 and the host device 200 conforms is not limited to a specific standard. For example, the communication interface conforms to the Serial Advanced Technology Attachment (SATA) standard, the Serial Attached SCSI (SAS) standard, the Peripheral Components Interconnect (PCI) Express (registered trademark) standard, and the like.

The memory system 100 includes a NAND memory 1 that is a NAND type flash memory, and a memory controller 2 that executes data transfer between the host device 200 and the NAND memory 1. The memory system 100 may include other types of memories instead of the NAND memory 1. For example, the memory system 100 may include a NOR type flash memory instead of the NAND memory 1.

The NAND memory 1 includes a plurality (here, four) of memory chips 11 as semiconductor memories. Also, the memory controller 2 includes, for example, two channels (e.g., ch.0, and ch.1). The memory controller 2 may include one channel or three or more channels.

Two memory chips 11 are connected to each channel. Each channel includes a control signal line, an I/O signal line, a chip enable (CE) signal line, and an RY/BY signal line (not shown in FIG. 1). The I/O signal line is a signal line for transmitting data, addresses, and various instructions. The memory controller 2 can transmit a read instruction, a write instruction, an erase instruction, and the like to the memory chip 11 via the I/O signal line. The control signal line includes a write enable (WE) signal line, a read enable (RE) signal line, a command latch enable (CLE) signal line, an address latch enable (ALE) signal line, a write protect (WP) signal line, and the like.

Figure 2:
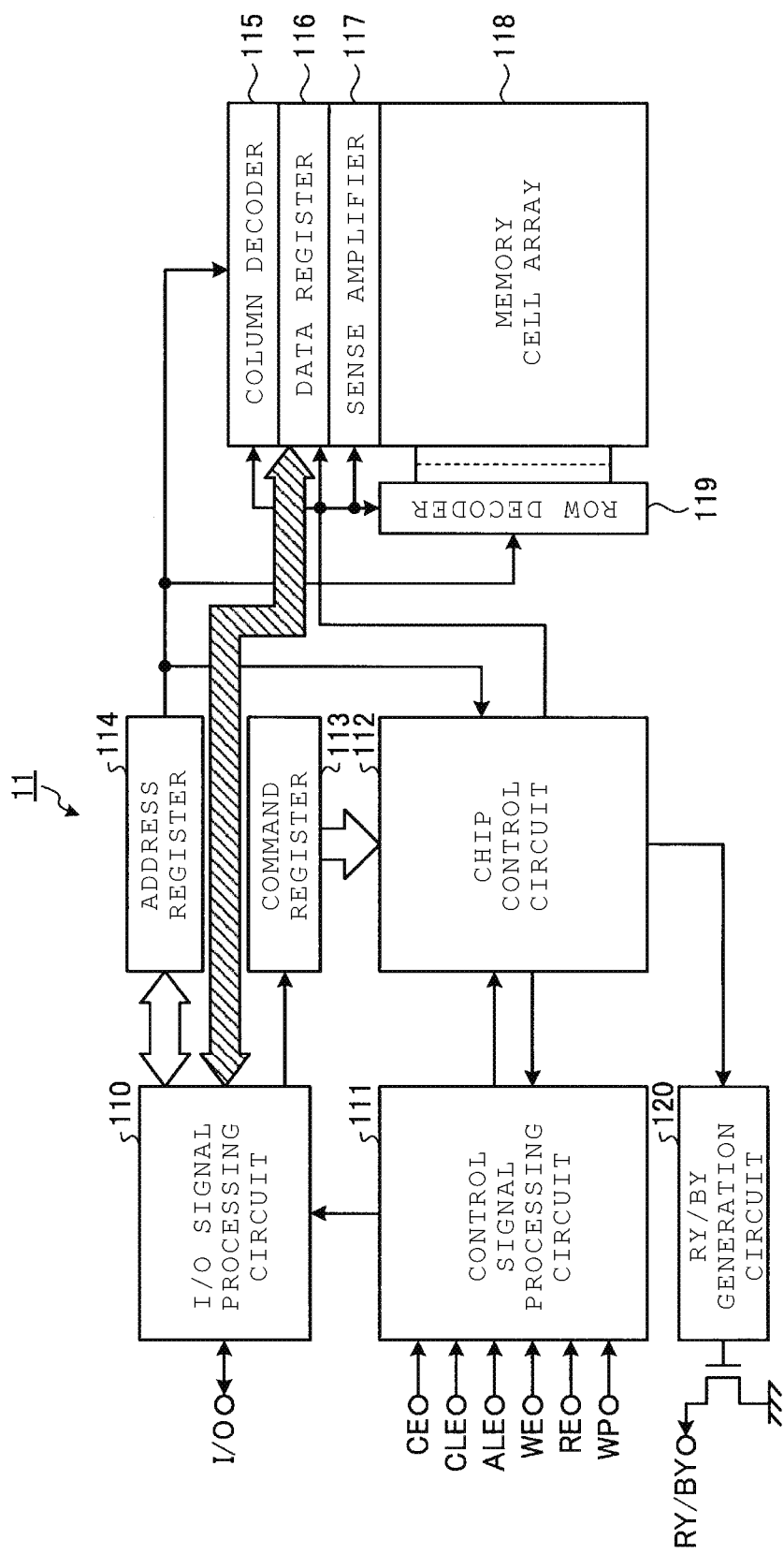
FIG. 2 is a diagram illustrating a configuration of a memory chip in the embodiment.

FIG. 2 is a diagram illustrating a configuration of each memory chip 11. The memory chip 11 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and an RY/BY generation circuit 120.

The chip control circuit 112 is a circuit that makes a state transition based on various control signals received via the control signal processing circuit 111. The chip control circuit 112 controls operations of the memory chip 11. The RY/BY generation circuit 120 changes a state of the RY/BY signal line between a ready state (RY) and a busy state (BY) under a control of the chip control circuit 112.

The I/O signal processing circuit 110 is a buffer circuit for transmitting and receiving I/O signals to and from the memory controller 2. A command latched by the I/O signal processing circuit 110, an address designating the access destination, and data are distributed and stored in the address register 114, the command register 113, and the data register 116, respectively.

The address stored in the address register 114 includes a chip number, a row address, and a column address. The chip number is identification information for distinguishing each memory chip 11. The chip number is read by the chip control circuit 112, the row address is read by the row decoder 119, and the column address is read by the column decoder 115.

The control signal processing circuit 111 receives an input of a control signal. Based on the received control signal, the control signal processing circuit 111 distributes I/O signals received by the I/O signal processing circuit 110 into corresponding registers. Further, the control signal processing circuit 111 transmits the received control signal to the chip control circuit 112.

The memory cell array 118 includes a plurality of blocks. The block is a storage area corresponding to a physical execution unit of erase. In other words, all data stored in one block is erased at once. This one block is also called a physical block.

Figure 3:
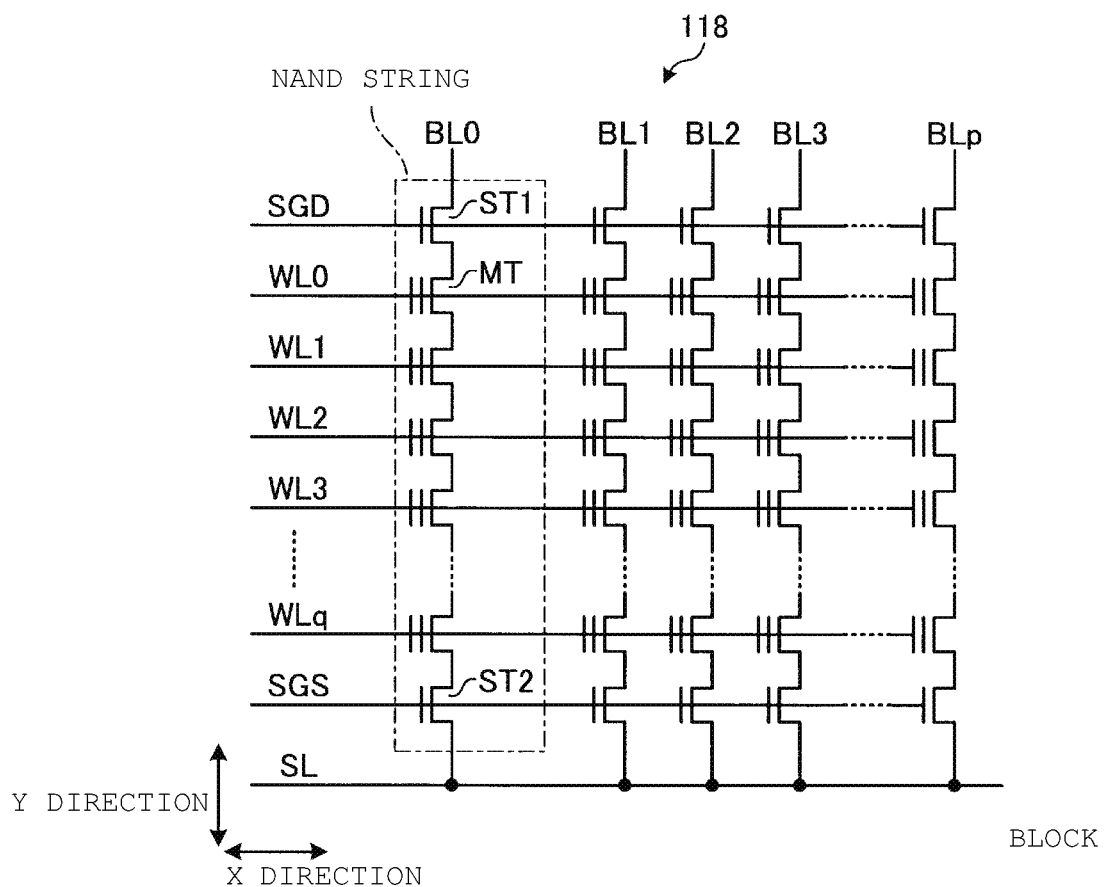
FIG. 3 is a circuit diagram illustrating a configuration of a memory cell array in the embodiment.

FIG. 3 is a circuit diagram illustrating a configuration of one block in the memory cell array 118. As illustrated in the drawing, each block includes (p+1) NAND strings arranged (p≥0) in order along an X direction. Each of select transistors ST1 in each of the (p+1) NAND strings has a drain connected to one of bit lines BL0 to BLp and a gate commonly connected to a select gate line SGD. In addition, each of select transistors ST2 has a source connected to a source line SL and a gate commonly connected to a select gate line SGS.

Each memory cell transistor MT is implemented by a Metal Oxide Semiconductor Field Effect Transistor (MOSFET) having a stacked gate structure formed on a semiconductor substrate. The stacked gate structure includes a floating gate formed on a semiconductor substrate with a tunnel oxide film interposed therebetween, and a control gate electrode formed on the floating gate with an inter-gate insulating film interposed therebetween. The threshold voltage changes according to the number of electrons stored in the floating gate. The memory cell transistor MT stores data according to the difference in threshold voltages. That is, the memory cell transistor MT stores an amount of electric charge corresponding to data in the floating gate.

In each NAND string, (q+1) memory cell transistors MT are arranged between the source of the select transistor ST1 and the drain of the select transistor ST2 such that current paths thereof are connected in series. Thus, the control gate electrodes are respectively connected to the word lines WL0 to WLq in order from the memory cell transistor MT located closest to the drain side. Therefore, the drain of the memory cell transistor MT connected to the word line WL0 is connected to the source of the select transistor ST1, and the source of the memory cell transistor MT connected to the word line WLq is connected to the drain of the select transistor ST2.

The word lines WL0 to WLq connect the control gate electrodes of the memory cell transistors MT in common between the NAND strings in the block. That is, the control gate electrodes of the memory cell transistors MT in the same row in the block are connected to the same word line WL. When each memory cell transistor MT is configured to be able to store a 1-bit value, (p+1) memory cell transistors MT connected to the same wordline WL are handled as one page, and data writing and data reading are performed for each page.

In some cases, each memory cell transistor MT is configured to be able to store a value of a plurality of bits. For example, when each memory cell transistor MT can store a value of n (n≥2) bits, the storage capacity per word line is equal to the size of n pages. Here, as an example, a storage method in which each memory cell transistor MT stores a 2-bit value (hereinafter, referred to as a 2-bit storage method) will be described. According to the 2-bit storage method, data for two pages are stored in each word line. Out of the two pages constituted by one word line, a page to be written first is referred to as a lower page, and a page to be written after the lower page is referred to as an upper page. Further, the memory cell transistor MT is simply referred to as a memory cell. There may be a mode in which writing is performed on a plurality of pages or all pages constituted by one word line.

Figure 4:
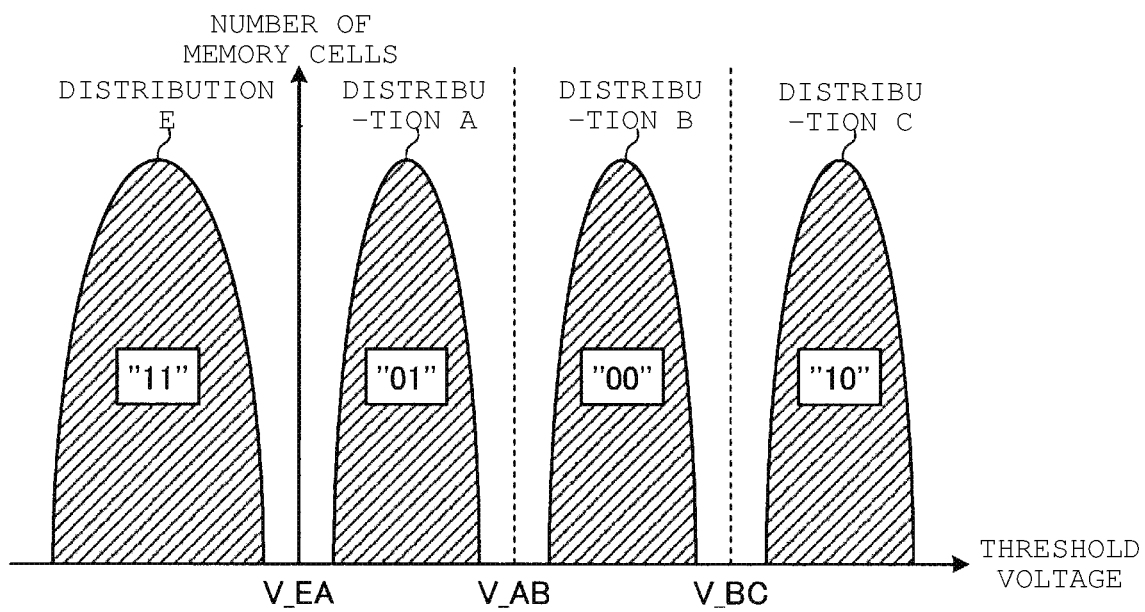
FIG. 4 is a diagram illustrating a distribution of a threshold voltage of memory cells when a 2-bit storage method is employed in the embodiment.

FIG. 4 is a diagram illustrating a distribution of the memory cells with respect to the threshold voltage when the 2-bit storage method is employed. In this drawing, the horizontal axis represents the threshold voltage, and the vertical axis represents the number of memory cells. According to the 2-bit storage method, each memory cell can store quaternary data "xy" defined by data "x" belonging to the upper page and data "y" belonging to the lower page. The values of the data "x" and the data "y" are the code "0" or the code "1". The threshold voltage of each memory cell is controlled to belong to one of four groups including a distribution E, a distribution A, a distribution B, and a distribution C. The correspondence between each distribution and the data value of the quaternary data "xy" is set in advance. For example, a data value "11" is assigned to the distribution E. A data value "01" is assigned to the distribution A. A data value "00" is assigned to the distribution B. A data value "10" is assigned to the distribution C. The correspondence between each distribution and the data value is not limited to the above. In one example, each data value is assigned to each distribution so that the Hamming distance between adjacent distributions is 1.

Referring back to FIG. 2, the row decoder 119, the column decoder 115, the data register 116, and the sense amplifier 117 make up a peripheral circuit for the memory cell array 118. The peripheral circuit executes access (i.e., read, write, and erase) to the memory cell array 118 based on the control by the chip control circuit 112.

For example, at the time of writing, the column decoder 115 selects and activates the bit line corresponding to the column address. The sense amplifier 117 sets the potential of the bit line selected by the column decoder 115 to 0 volts. The row decoder 119 applies a write pulse to the word line corresponding to the row address. Then, electrons are injected into the floating gate of the memory cell located at the intersection of the selected bit line and the selected word line, and as a result, the threshold voltage of the floating gate rises. After the write pulse is applied, the sense amplifier 117 checks whether or not the threshold voltage has reached a voltage corresponding to the data stored in the data register 116. The sense amplifier 117 causes the row decoder 119 to continue applying the write pulse until the threshold voltage reaches a voltage corresponding to the data.

At the time of reading, the sense amplifier 117 pre-charges the power supply potential Vcc to the bit line BL, and the row decoder 119 sequentially applies a plurality of types of determination potentials (hereinafter, referred to as "read voltages") for specifying the distribution for each data value ("11", "01", "00", and "10") to the selected word line WL. The row decoder 119 applies a transfer potential to the non-selected word line WL, and keeps the memory cells belonging to the non-selected word line WL conductive. The sense amplifier 117 determines the data value stored in the target memory cell by detecting which read voltage is applied when the electric charge stored by the pre-charge flows out to the source line SL.

For example, as illustrated in FIG. 4, a read voltage V_EA is set between the distribution E and the distribution A, a read voltage V_AB is set between the distribution A and the distribution B, and a read voltage V_BC is set between the distribution B and the distribution C.

When the read target is the lower page, the read voltage V_AB is used for the determination. When the outflow of the electric charge to the source line SL is detected when the read voltage V_AB is applied, the sense amplifier 117 determines that the target memory cell stores the data value "1". Further, when the outflow of the electric charge to the source line SL is not detected when the read voltage V_AB is applied, the sense amplifier 117 determines that the target memory cell stores the data value "0".

When the read target is the upper page, the read voltage V_EA and the read voltage V_BC are used for the determination. When the outflow of electric charge is detected when the read voltage V_EA is applied, or when the outflow of electric charge is not detected when either of the read voltage V_EA and the read voltage V_BC is applied, the sense amplifier 117 determines that the target memory cell stores the data value "1". When the outflow of electric charge is not detected when the read voltage V_EA is applied, and when the outflow of electric charge is detected when the read voltage V_BC is applied, the sense amplifier 117 determines that the target memory cell stores the data value "0".

At the time of erasing, an erase voltage is applied to the substrate of the memory cell array 118 by a potential generation circuit (not illustrated). Thus, the row decoder 119 conducts all the word lines WL of the block to be erased to the ground potential. Then, in each memory cell in the selected block, the electric charge stored in the floating gate is released. As a result, the state of each memory cell in the selected block transitions to the erased state (that is, the state in which the data value "11" is stored).

The sense amplifier 117 stores the read data in the data register 116. The data stored in the data register 116 is sent to the I/O signal processing circuit 110 through the data line, and transferred from the I/O signal processing circuit 110 to the memory controller 2.

The values of the read voltages V_EA to V_BC are stored in a non-volatile storage unit provided in the memory chip 11. For example, the memory chip 11 stores fixed reference values of the read voltages V_EA to V_BC. As a reference value for each of the read voltages V_EA to V_BC, a common value may be set for the plurality of memory chips 11, or a different reference value may be set for each memory chip 11. In addition, as a reference value for each of the read voltages V_EA to V_BC, a common value may be set for each block or for each unit different from the block. The reference value setting method is not limited to a specific method. The memory controller 2 may set a reference value for each read voltage by transmitting a predetermined command to the target memory chip 11.

Figure 5:
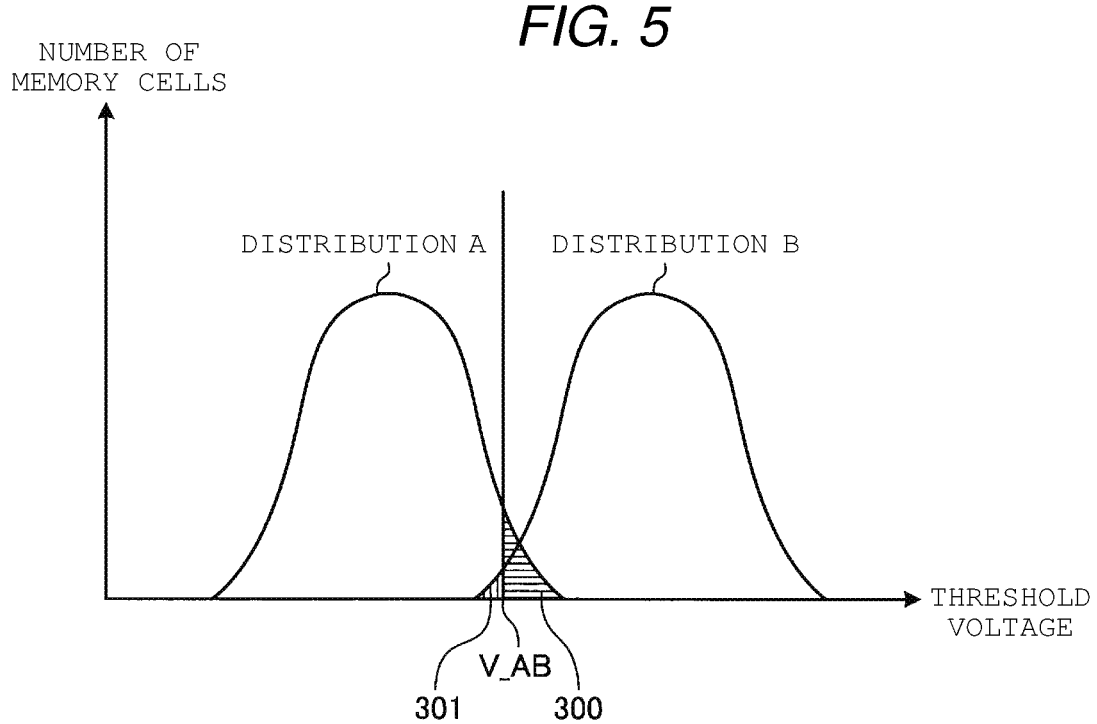
FIG. 5 is an explanatory diagram of each distribution after a state change of the threshold voltage of the memory cells in the embodiment.

In the memory chip 11, the amount of electric charge stored in the floating gate changes over time. Further, the amount of electric charge stored in the floating gate also changes due to reading or writing to an adjacent memory cell. FIG. 5 is an explanatory diagram of each distribution after the change. In FIG. 5, only the distribution A and the distribution B are illustrated for simplicity. Further, the distribution A and the distribution B are illustrated separately. According to this example, the tail of the distribution A and the tail of the distribution B overlap. The maximum value of the distribution A exceeds the read voltage V_AB, and the minimum value of the distribution B is lower than the read voltage V_AB. When a memory cell belonging to the distribution A and having a threshold voltage larger than V_AB (that is, a memory cell in a region 300) is read, the memory cell is recognized as belonging to the distribution B. That is, the data value written as "01" is read as "00". When a memory cell belonging to the distribution B and having a threshold voltage lower than V_AB (that is, a memory cell in a region 301) is read, the memory cell is recognized as belonging to the distribution A. That is, the data value written as "00" is read as "01". The data value changed from the time of writing is detected as an error bit in the memory controller 2 at the time of reading. In the memory controller 2, the detected error bit is tried to be corrected by an Error Checking and Correction (ECC) circuit 25 (see FIG. 1) described later.

Referring back to FIG. 1, the memory controller 2 can read the data by changing the set value of the read voltage. The number of error bits at the time of reading the data may be reduced by changing the set value of the read voltage. Hereinafter, reading by changing the set value of the read voltage is referred to as shift reading.

In one example, the memory controller 2 causes an ECC circuit 25 to correct the value of the read data that has changed since the time of writing and restores the data at the time of writing. When the error correction by the ECC circuit 25 fails, the memory controller 2 reads data again by shift reading. The memory controller 2 can execute the error correction again, by the ECC circuit 25, on the data obtained by the shift reading. The method for changing the set value of the read voltage at the time of shift reading is not limited to a specific method. For example, shift reading is repeatedly executed X times (i.e., a predetermined number of times as an upper limit) until the error correction is successful.

The failure in error correction means that data at the time of writing cannot be restored from the read data. Specifically, the failure in error correction means that error bits included in the read data cannot be corrected. The success in error correction means that all error bits included in the read data are corrected.

The memory controller 2 includes a host I/F (interface) controller 21, a Random Access Memory (RAM) 22, a NANDC (NAND controller) 23, a Central Processing Unit (CPU) 24, and the ECC circuit 25. The host I/F controller 21, the RAM 22, each NAND controller 23, the CPU 24, and the ECC circuit 25 are connected to each other via a bus. The memory controller 2 may be a single IC (integrated circuit) in which the host I/F controller 21, the RAM 22, each NAND controller 23, the CPU 24, and the ECC circuit 25 are integrated. Further, the host I/F controller 21, the RAM 22, each NAND controller 23, the CPU 24, and a part of the ECC circuit 25 may be provided outside the memory controller 2.

The RAM 22 functions as a buffer for data transfer between the host device 200 and the NAND memory 1. The RAM 22 provides a work area to the CPU 24. The RAM 22 stores various management information.

The type of the RAM 22 is not limited to a specific type. As a type of the RAM 22, for example, a Synchronous Dynamic Random Access Memory (SDRAM) or a Static Random Access Memory (SRAM) can be employed.

The host I/F controller 21 executes the control of the communication interface between the host device 200 and the memory system 100 and the control of data transfer between the host device 200 and the RAM 22, under the control of the CPU 24.

The NAND controller 23 controls each channel (i.e., ch.0 and ch.1). The NAND controller 23 executes the control of data transfer between the NAND memory 1 and the RAM 22 under the control of the CPU 24.

The ECC circuit 25 performs encoding for error correction on the data to be written to the NAND memory 1 and executes the error correction on the data read from the NAND memory 1.

The ECC circuit 25 performs encoding according to a code rate variable method. The code rate variable method is a method in which the code rate or coding rate can be changed according to the required correction capability. The code rate is a ratio of the size of data before encoding to the size of the correction frame. A correction frame is a unit in which the error correction is performed. The smaller the code rate, the higher the correction capability. The correction capability is the number of error bits that can be corrected per predetermined size of data (for example, 1 KB). The type of code employed is not limited to a specific type. For example, a BCH code or a low-density parity-check code (LDPC) can be employed.

In the following, the bit error rate (BER) is a value obtained by dividing the number of error bits of user data detected by the ECC circuit 25 by the total number of bits. The number of error bits is also called a Fail Bit Count (FBC).

For example, the ECC circuit 25 can perform four stages of error correction processing including L1 correction (i.e., error correction processing using L1 code), L2 correction (i.e., error correction processing using L2 code), L3 correction (i.e., error correction processing using L3 code), and L4 correction (i.e., error correction processing using L4 code). Further, the degree of dispersion of the encoding process increases in the order of the L1 code, the L2 code, the L3 code, and the L4 code. The data to be encoded by the L1 code and the L2 code is data in one memory chip, whereas the data to be encoded by the L3 code and the L4 code is data across a plurality of memory chips. The frame length for the L2 correction is larger than the frame length for the L1 correction. Further, the number of correction frames used in the L4 correction is larger than the number of correction frames used in the L3 correction.

For example, the ECC circuit 25 performs the L1 correction, performs the L2 correction when an L1 correction error occurs, performs the L3 correction when an L2 correction error occurs, and performs the L4 correction when an L3 correction error occurs. Thus, the ECC circuit 25 can perform error correction processing in the order of L1 correction, L2 correction, L3 correction, and L4 correction until the error correction processing is successful. In addition, the error correction processing may return to the L3 correction after the L4 correction. Further, the L2 correction or the like may be skipped.

The CPU 24 functions as a processing unit configured to perform firmware or the like. The firmware is stored in advance, for example, in the NAND memory 1 in a non-volatile manner, and is loaded into a work area in the RAM 22 when the memory system 100 is booted. The CPU 24 executes the firmware loaded in the work area. The firmware may be stored in an external ROM (not illustrated) such as SFROM (Serial Flash ROM). The SFROM is connected to the bus or the CPU 24 in the memory controller 2.

The CPU 24 obtains a trend of the temporal change in a bit error rate for each block of the NAND memory 1 and determines a timing of refresh operation based on the trend. The refresh operation is a process of performing the error correction on the read data and writing the error-corrected read data to another block in unit of block. Alternatively, in the refresh operation, the error-corrected read data may be written to the same block.

Further, a variable length code is used as the error correction code, and the CPU 24 sets the coding rate of the variable length code assigned to the data based on the trend.

The CPU 24 manages a predetermined index value that is larger as a predicted period in which data can be maintained (hereinafter, also simply referred to as the predicted period) is shorter, as an index indicating the trend and being a part of the management information. The CPU 24 calculates a regression equation regarding the passage of time and the change of the index value based on the index value, estimates the state of the memory system 100 at a certain time in the future based on the calculated regression equation, and estimates the index value after returning from power-off.

In addition, the memory controller 2 stores an addition value table that stores an addition value for the index value in accordance with the temperature of the NAND memory 1 and the number of times of writing/erasing of one or more blocks. The CPU 24 manages the index value for each particular storage area in the NAND memory 1, acquires the temperature of the NAND memory 1 and the number of times of writing/erasing in a certain cycle, and adds the corresponding addition value to the index value based on the addition value table.

Further, the CPU 24 calculates the bit error rate based on the data read result obtained by the read voltage determined by Vth tracking for searching the valley position in the distribution of the memory cell of the NAND memory 1 with respect to the threshold voltage, and the result of error correction of the data.

Further, when the refresh operation is performed, the CPU 24 resets the index value corresponding to the block on which the refresh operation has been performed to 0. Details of these functions by the CPU 24 will be described later.

Figure 6:
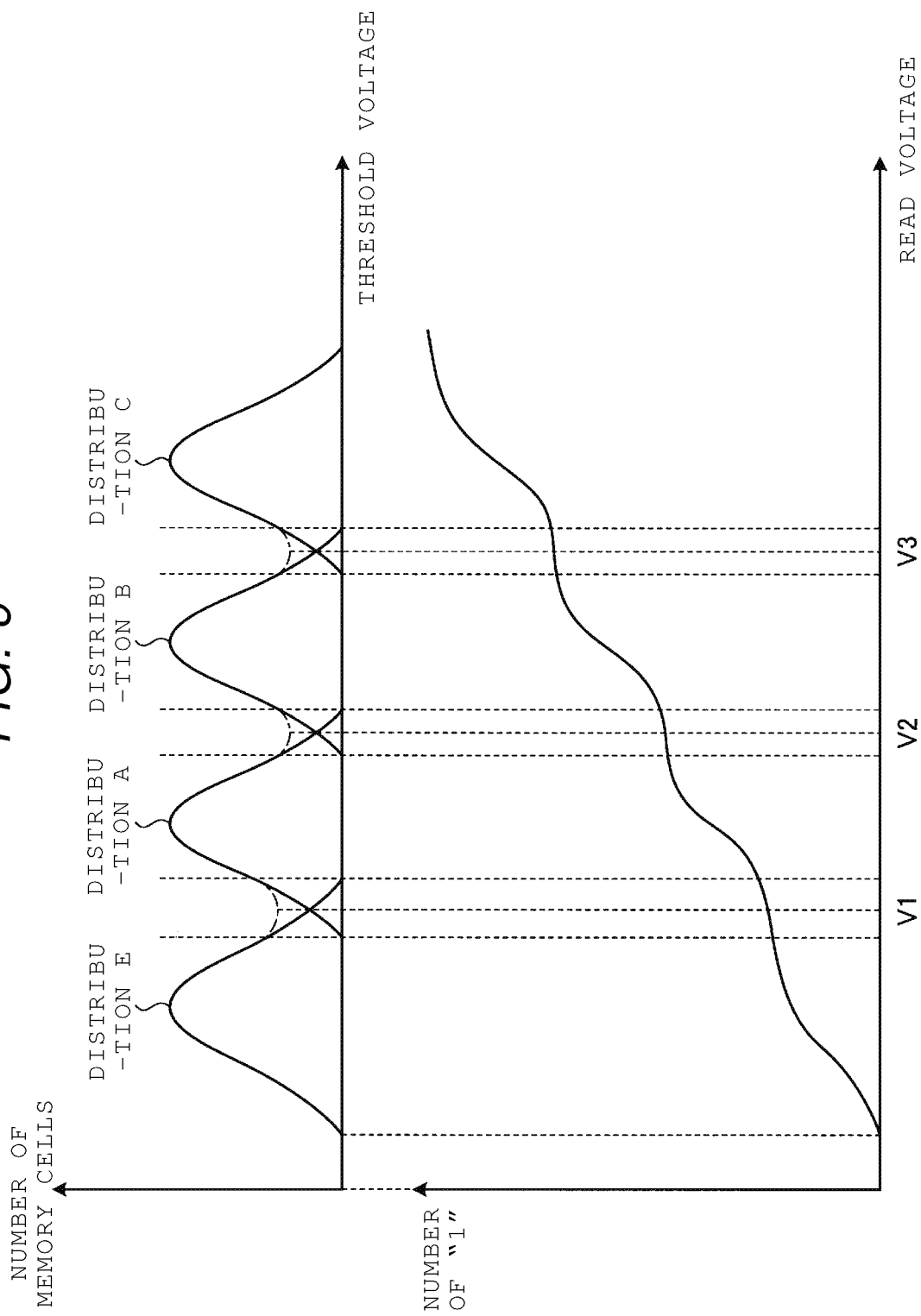
FIG. 6 is an explanatory diagram of Vth tracking in the embodiment.

FIG. 6 is an explanatory diagram of Vth tracking. The upper graph in FIG. 6 illustrates an example of the memory cell distribution. According to Vth tracking, when the tails between distributions having different corresponding data values overlap, the total number of memory cells belonging to the plurality of overlapping distributions is obtained at a read voltage in a range where the plurality of distributions overlap. That is, in the example of the upper graph in FIG. 6, the shape indicated by the dash-dot line is obtained by measurement at a read voltage in a range where the tails overlap between adjacent distributions. The Vth tracking is also referred to as tracking operation or tracking.

In the Vth tracking, shift reading is executed in the binary mode while changing the set value of the read voltage, and the number of "1" or "0" included in the data obtained by each shift reading is counted. The binary mode is a mode in which a memory cell whose threshold voltage is lower than the read voltage is determined to store a first data value, and a memory cell whose threshold voltage is higher than the read voltage is determined to store a second data value different from the first data value. Here, as an example, "1" is the first data value, "0" is the second data value, and the number of "1" is counted. When the counted number of "1" is plotted against the read voltage, the curve illustrated in the lower part of FIG. 6 is obtained.

Subsequently, the change rate of the number "1" is calculated. The change rate of the number "1" is the change amount of the number "1" when the read voltage is changed by a predetermined unit amount. When the change rate is plotted against the read voltage, an approximation of the distribution of the memory cells (that is, the curve illustrated in the upper part of FIG. 6) with respect to the threshold voltage is obtained.

As an example, the CPU 24 performs shift reading while increasing the set value of the read voltage by Vstep in the Vth tracking. Then, the CPU 24 calculates the change amount of the number "1" when the read voltage is increased by Vstep, as the change rate. Then, the CPU 24 determines the read voltage that minimizes the change amount as the optimum voltage value. In the example of FIG. 6, V1, V2, and V3 correspond to the optimum voltage values.

In the Vth tracking, the CPU 24 performs a plurality of times of shift reading while increasing the set value of the read voltage by Vstep. The change range of the read voltage may cover the entire range that can be taken by the threshold voltage of the memory cell, or may cover only the range near a specific voltage value.

Further, the CPU 24 may count the number of "0" instead of the number of "1". In that case, the CPU 24 can obtain an approximation of the distribution of the memory cells with respect to the threshold voltage by calculating the absolute value of the change amount of the number "0".

Figure 7:
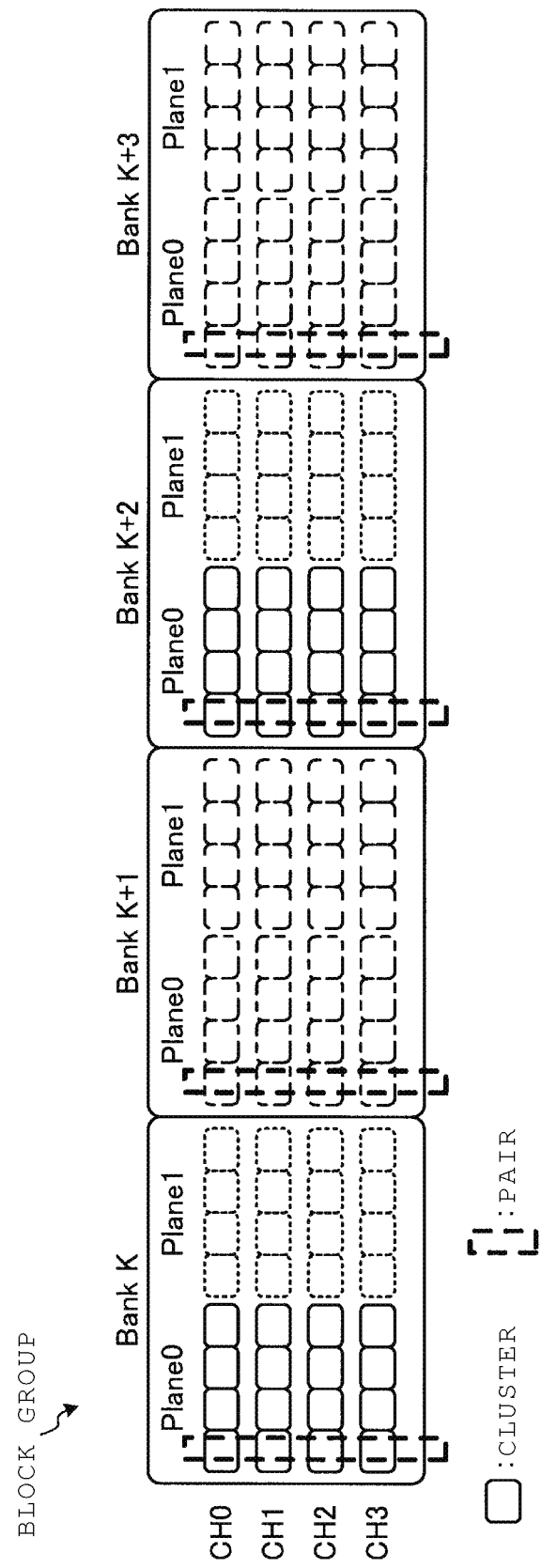
FIG. 7 is a diagram for illustrating a data management unit in the embodiment.

FIG. 7 is a diagram for illustrating a data management unit. Here, it is assumed that the memory controller 2 includes four channels (i.e., ch0, ch1, ch2, and ch3). In addition, a plurality of banks are constituted by each channel, and a parallel operation by bank interleaving is possible. In the example of FIG. 7, four parallel operations by four banks (i.e., Bank k, Bank k+1, Bank k+2, and Bank k+3) can be performed.

Each bank is divided into a plurality of planes (e.g., planes 0 and 1). Each plane includes an independent peripheral circuit, and by using the plane double speed mode, it is possible to simultaneously perform erase/write/read. The peripheral circuit includes, for example, the row decoder 119, the column decoder 115, a page buffer, and the data register 116. Such a management unit includes four channels (i.e., ch0, ch1, ch2, and ch3) and four banks (i.e., Bank k, Bank k+1, Bank k+2, and Bank k+3) is referred to as a block group.

As described above, the block group can perform a parallel operation using a plurality of channels, a parallel operation using a plurality of banks, and a parallel operation using a plurality of planes. As illustrated in the example of FIG. 7, when the number of channels is 4, the number of banks is 4, and the number of planes is 2, it is possible to operate a maximum of 32 blocks in parallel.

Thus, such a block group has a correction frame that is a unit of the L1 correction in a certain unit in the illustrated horizontal direction (for example, two or four out of eight sectors making up one cluster out of four clusters in one plane). In addition, a certain unit (e.g., the illustrated pair in FIG. 7) in the illustrated vertical direction has a plurality of correction frames that are elements of the L3 correction.

The coding rate in the variable length code can be managed by a block group management table stored in the memory controller 2. The block group management table is a table for managing the physical blocks of the NAND memory 1 belonging to the block group. In this case, for example, one coding rate corresponds to one block group management table. If there is even one cluster that cannot be read by the L1 correction in the block group, the CPU 24 performs refresh operation on the block group for data protection. The coding rate in the variable length code may be managed not by a block group management table but by a logical physical conversion table.

Figure 8:
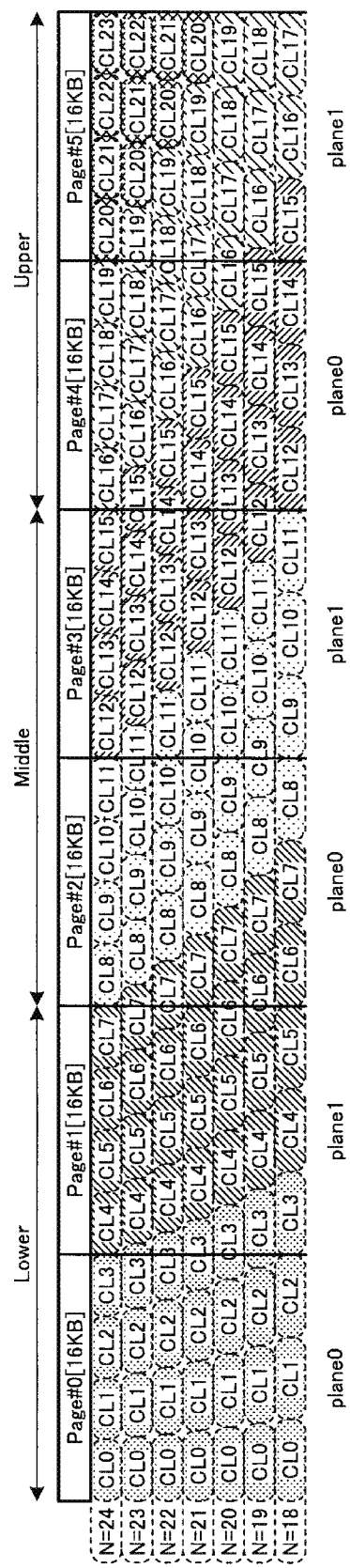
FIG. 8 is a diagram for illustrating variable length codes in the embodiment.

FIG. 8 is a diagram for illustrating the variable length code. As described above, when a variable length code is used as an error correction code, the error correction performance is improved if the coding rate is reduced (that is, the code is lengthened). In some cases, each memory cell transistor is configured to be able to store a value of a plurality of bits. For example, when each memory cell transistor can store a value of n (n≥2) bits, the storage capacity per word line WL is equal to the size of n physical pages. That is, each memory cell group is handled as n physical pages. For example, in a multi-level cell (MLC) mode in which each memory cell transistor stores a 2-bit value, data for two physical pages (i.e., Upper page, and Lower page) is stored in each word line WL. In the triple-level cell (TLC) mode in which each memory cell transistor stores a 3-bit value, data for three physical pages (i.e., Upper page, Middle page, and Lower page) is stored in each word line. In the quad-level cell (QLC) mode in which each memory cell transistor stores a 4-bit value, data for four physical pages is stored in each word line.

Further, when each memory cell transistor is configured to be able to store a 1-bit value (i.e., when operating in a single-level cell (SLC) mode), (p+1) memory cell transistors (that is, a memory group) connected to the same word line is handled as one physical page, and a data write operation and a data read operation are performed for each physical page.

FIG. 8 is an example based on TLC. For example, in the case of 2 planes (e.g., Planes 0 and 1) and 16 KB/page (i.e., physical page), if a normal coding rate is C24 (N=24), data corresponding to a total of 24 clusters CL0 to C23 can be written to two physical pages. As the coding rate decreases, such as C23 (N=23), C22 (N=22), . . . , the number of clusters that can be written to two physical pages decreases. For example, in the case of C18 (N=18), only 18 clusters (CL0 to 17) can be written in total, but the correction capability is the highest among the coding rates illustrated in FIG. 8.

If the SLC mode is used, there is no page straddling to record a cluster across a plurality of units in units of 2 planes (2 pages), and thus, the available coding rates are C24, C21, and C18.

FIG. 9 is a diagram illustrating an addition value table according to the embodiment. As described above, the addition value table stores an addition value "RD" corresponding to an index value (hereinafter, also referred to as "RDP" (Retention Degree Progress)) according to the temperature of the NAND memory 1 and the number of times of writing (W)/erasing (E). RDP is a value that increases as the predicted period is shorter. The addition value table is represented by a matrix of the NAND temperature and the number of times of W/E, and an addition value "RD" corresponding to each value is determined in advance. This addition value table is a part of the management information, is stored in the NAND memory 1 in a non-volatile manner, and is loaded into the RAM 22 when the memory system 100 is in operation.

Figure 11:
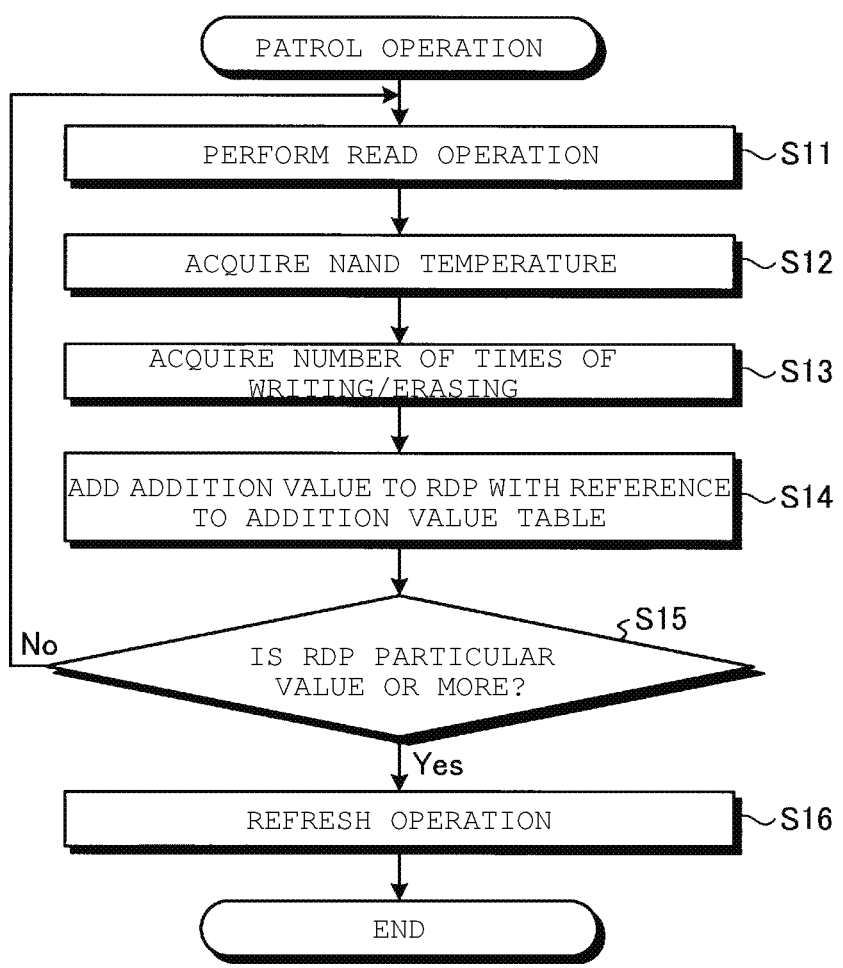
FIG. 11 is a flowchart illustrating a part of patrol operation in the memory system according to the embodiment.

For example, the memory controller 2 includes an RDP counter for each certain address in the NAND memory 1 (i.e., physical address of the NAND memory 1). The initial value of RDP is 0. The CPU 24 controls the patrol operation and uses the RDP in the patrol operation. The CPU 24 may use a single addition value table at all addresses in the NAND memory 1 or may use a plurality of addition value tables having different addition values "RD". Here, the patrol operation executed in the memory system 100 of the embodiment will be described. FIG. 11 is a flowchart illustrating a part of the patrol operation in the memory system 100 according to the embodiment. This patrol operation is performed for each particular storage area in the NAND memory 1 at a certain cycle (for example, every several hours).

First, in S11, the CPU 24 executes read operation. Details of the read operation will be described later. Next, in S12, the CPU 24 acquires the temperature of the NAND memory 1 from a temperature sensor (not illustrated). For example, each memory chip 11 may include a temperature sensor, and the CPU 24 may acquire the temperature for each memory chip 11. If the temperature of the NAND memory 1 has changed within a certain period, the highest temperature (i.e., worst case) is used.

Next, in S13, the CPU 24 acquires the number of times of writing/erasing from the block group management table. The CPU 24 may acquire the number of times of writing/erasing from other management information.

Next, in S14, the CPU 24 refers to the addition value table illustrated in FIG. 9, and adds the corresponding addition value RD to the index value RDP according to the temperature of the NAND memory 1 and the number of times of writing/erasing. For example, when the temperature of the NAND memory 1 is (40) to 45° C. and the number of times of W/E is 7 k to (8 k), 200 is selected as the addition value RD.

Next, in S15, the CPU 24 determines whether or not the RDP has reached a particular value (for example, 20000) or more, and if Yes, performs a refresh operation (S16). If the RDP is not greater than or equal to the particular value (No in S15), the process returns to S11. This particular value is a refresh threshold.

FIG. 10 is a coding rate determination table showing the correction capability and the like of variable length codes in the embodiment. This table is stored as apart of management information. The memory controller 2 manages this table for each physical block or for each block group. In this table, the error bit threshold and the number of correctable bits/frame are indicated for each coding rate type or BB (defective block). Here, the error bit threshold is 90% of the number of correctable bits/frame. That is, when the number of error bits per frame exceeds the error bit threshold corresponding to the current coding rate type, the memory controller 2 changes the coding rate type to the right one (for example, from C24 to C23). When the number of error bits per frame exceeds the error bit threshold corresponding to the coding rate type C18, the memory controller 2 registers a defective block (that is, non-use registration) for the corresponding physical block or block group.

Figure 12:
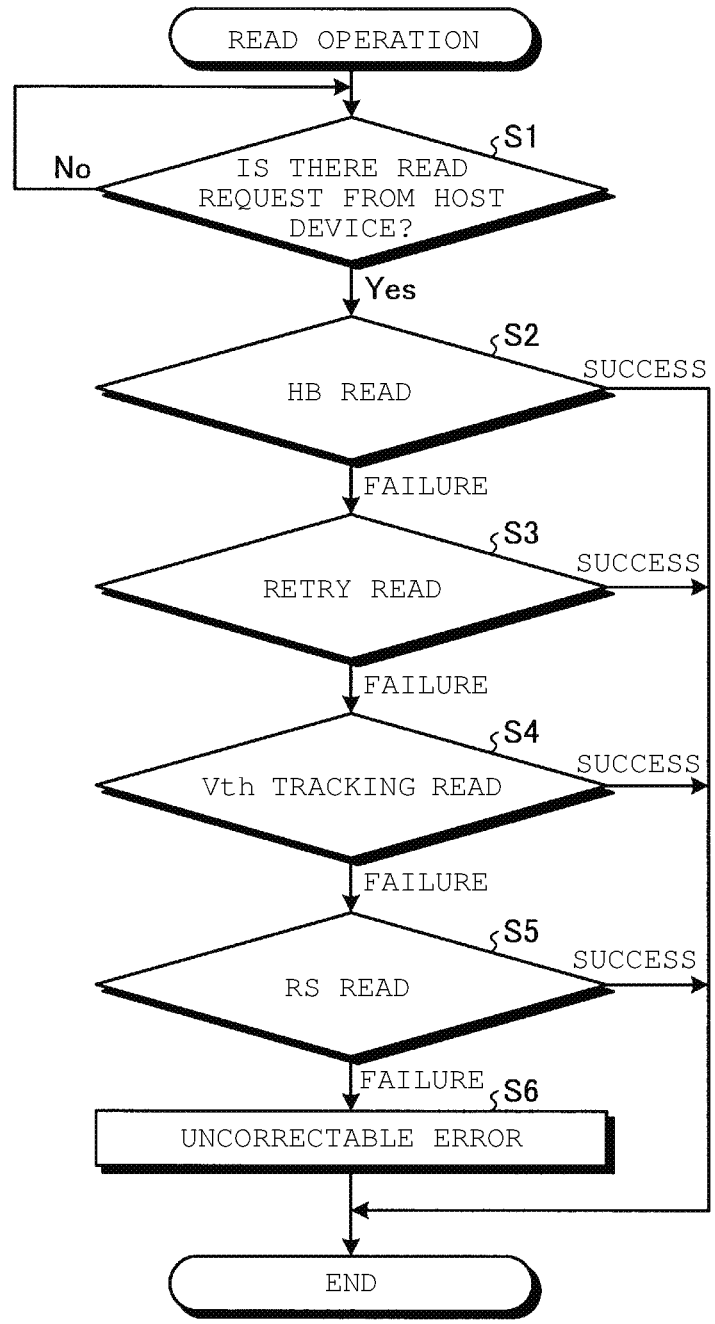
FIG. 12 is a flowchart illustrating a read operation in the memory system according to the embodiment.

FIG. 12 is a flowchart illustrating read operation in the memory system 100 of the embodiment. First, in S1, the CPU 24 determines whether or not there is a read request. If Yes, the process proceeds to S2, and if No, the process returns to S1. The read request includes both a request from the host device 200 and a request for background processing generated in the memory system 100.

In S2, the CPU 24 executes HB read (Hard Bit Read (i.e., read using the L1 correction)) on the target data of the read request, and the process ends if successful and proceeds to S3 if unsuccessful.

In S3, the CPU 24 executes retry read (i.e., read using the L2 correction) on the target data, and the process ends if successful, and proceeds to S4 if unsuccessful.

In S4, the CPU 24 executes Vth tracking read (i.e., read using the L3 correction) on the target data, and the process ends if successful and proceeds to S5 if unsuccessful.

In S5, the CPU 24 performs RS (Reed-Solomon) read (i.e., read using the L4 correction) on the target data, and the process ends if successful, and proceeds to S6 if unsuccessful.

In S6, the CPU 24 determines that the target data has an uncorrectable error, and if the read request is received from the host device 200, the host device 200 is notified of the occurrence of the error.

Figure 13:
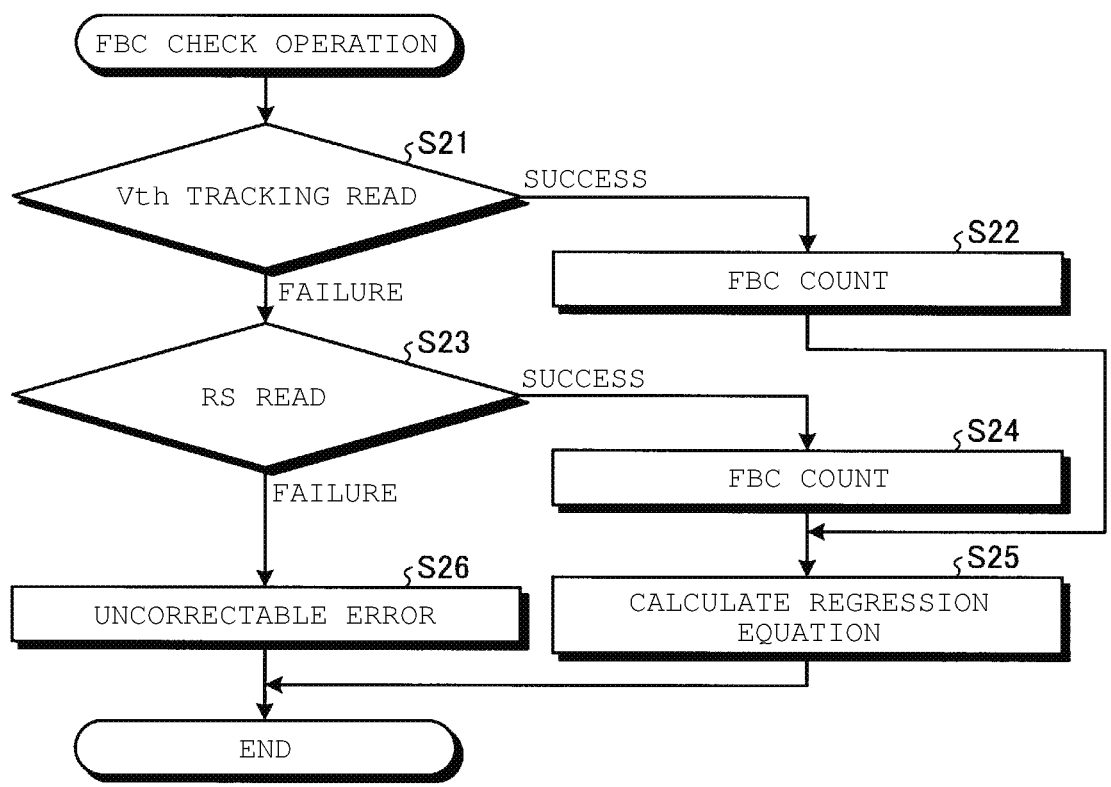
FIG. 13 is a flowchart illustrating an FBC check operation in the memory system according to the embodiment.

FIG. 13 is a flowchart illustrating the FBC check operation in the memory system 100 according to the embodiment. The FBC check operation can be executed in parallel with the processes of S4 to S5 in FIG. 11. First, in S21, the CPU 24 executes Vth tracking read (i.e., read using the L3 correction) corresponding to S4 in FIG. 11, and the process proceeds to S22 if successful, and proceeds to S23 if unsuccessful. In S22, the CPU 24 counts FBC. For example, the CPU 24 can calculate the FBC based on the number of bits of the read data and the number of bits determined to have an error.

In S23, the CPU 24 executes RS read corresponding to S5 in FIG. 11 (i.e., read using the L4 correction), and the process proceeds to S24 if successful, and proceeds to S26 if unsuccessful.

In S24, the CPU 24 counts FBC. In this case, for example, the CPU 24 calculates the FBC by comparing the read data acquired in the Vth tracking read (S21) with the data corrected in the RS read (S23).

In S26, as in S6 of FIG. 11, the CPU 24 determines that the target data has an uncorrectable error, and if the read request is received from the host device 200, the host device 200 is notified of the occurrence of the error.

Further, after S22 and S24, in S25, the CPU 24 calculates a coefficient of the regression equation (details will be described later).

The target of the FBC check operation may be a physical block including data that has become an uncorrectable error, or may be a block group including the physical block.

Figure 14:
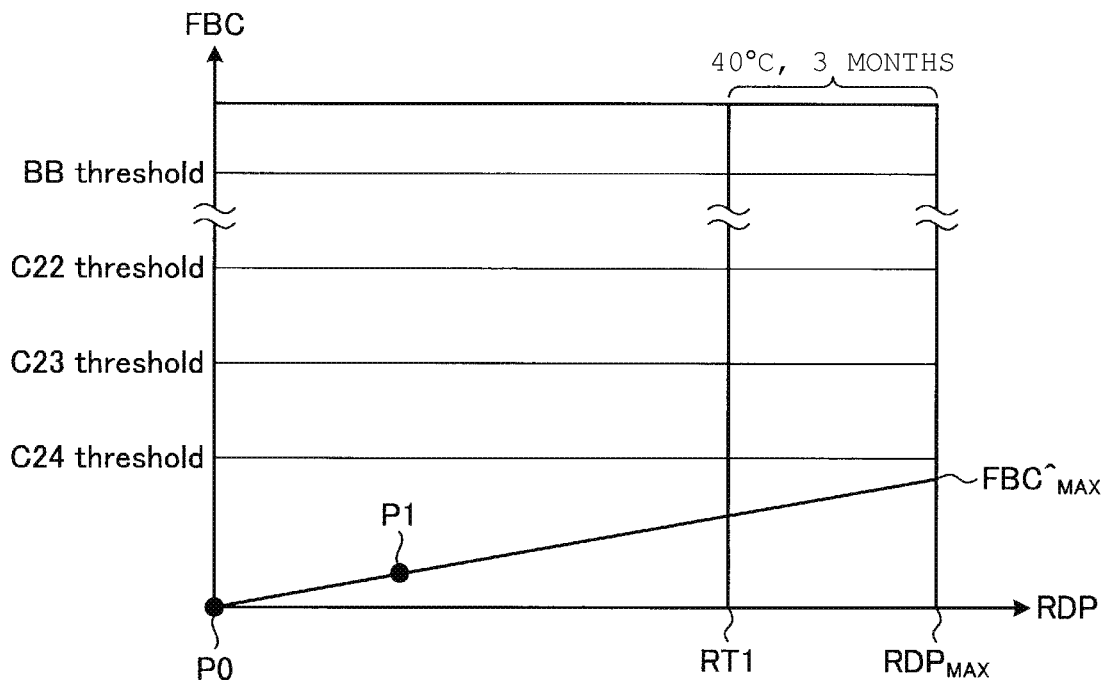
FIG. 14 is a graph illustrating a first processing example according to the embodiment.

FIG. 14 is a graph illustrating a first processing example of the embodiment. The horizontal axis is RDP and the vertical axis is FBC. On the vertical axis, BB threshold, C22 threshold, C23 threshold, and C24 threshold respectively correspond to the error bit thresholds in FIG. 10. Also, on the horizontal axis, the refresh operation timing RT1 and the $RDP_{MAX}$ corresponding to the timing after 3 months at the environmental temperature of 40° C. after the refresh operation timing RT1 are illustrated. In addition, it is assumed that the current coding rate type is C24 (for example, the error bit threshold is 54) (see FIG. 10).

In this case, when the CPU 24 executes the FBC check operation (FIG. 13) at any timing and the point corresponding to the RDP and FBC values is a point P1, the CPU 24 calculates, for example, a linear or primary regression equation based on the point P0 as the origin of the graph and the point P1. Thereafter, the CPU 24 obtains $FBC\hat{}_{Max}$, which is the FBC for $RDP_{MAX}$, based on the regression equation. As a result, since $FBC\hat{}_{Max}$ is smaller than C24 threshold, the CPU 24 does not perform any processing. However, for example, the refresh operation timing RT1 may be shifted later (that is, the refresh threshold may be increased) within a range where $FBC\hat{}_{Max}$ does not exceed C24 threshold.

Here, in order to simplify the description, a linear regression equation is used, but a regression equation of a curve such as a logarithmic function or a polynomial may be used. For example, the regression equation may be updated each time the FBC is checked.

Figure 15:
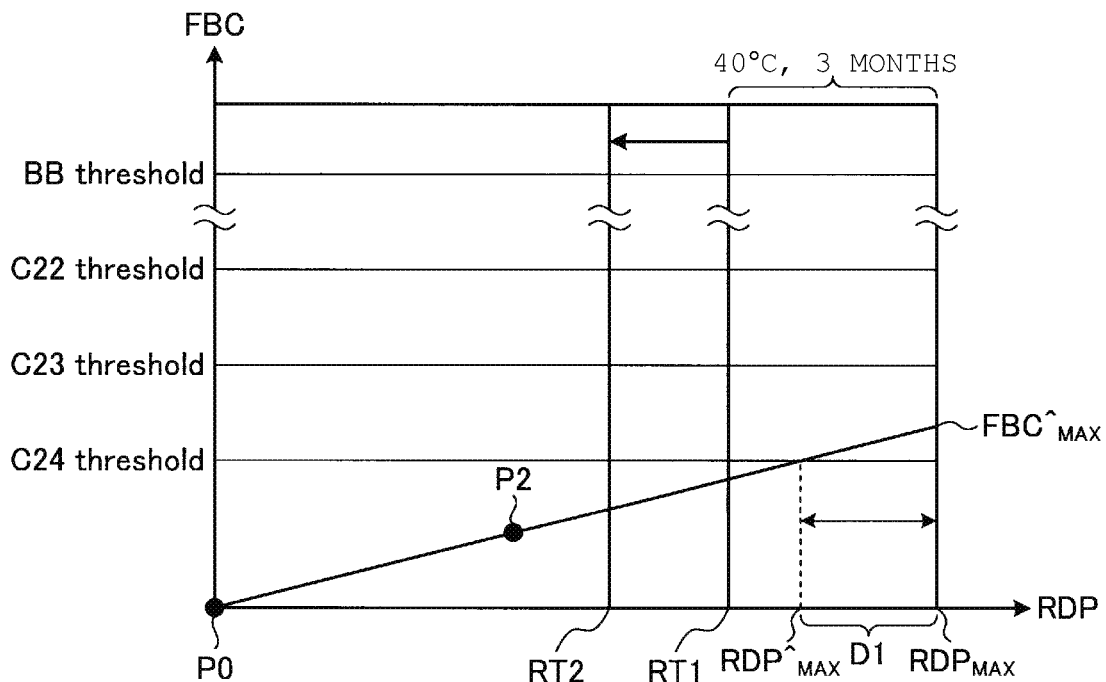
FIG. 15 is a graph illustrating a second processing example according to the embodiment.

FIG. 15 is a graph illustrating a second processing example of the embodiment. When the CPU 24 executes the FBC check operation (FIG. 13) at any timing and the point corresponding to the values of RDP and FBC is a point P2, based on the point P0 as the origin of the graph and the point P2, the CPU 24 calculates, for example, a linear or primary regression equation. Thereafter, the CPU 24 obtains $FBC\hat{}_{Max}$ based on the regression equation. Then, since $FBC\hat{}_{Max}$ is larger than C24 threshold and smaller than C23 threshold, the CPU 24 shifts the refresh operation timing RT1 forward to RT2 (i.e., refresh threshold is lowered) by a width D1 from $RDP_{Max}$ to $RDP\hat{}_{Max}$ (i.e., the intersection of the regression line and C24 threshold). As a result, the reliability of function guarantee for the three months at an environmental temperature of 40° C. is improved.

The CPU 24 records that the coding rate type is changed from C24 to C23. That is, the coding rate to be used next is C23 instead of C24 for the target physical position. Details will be described later.

Figure 16:
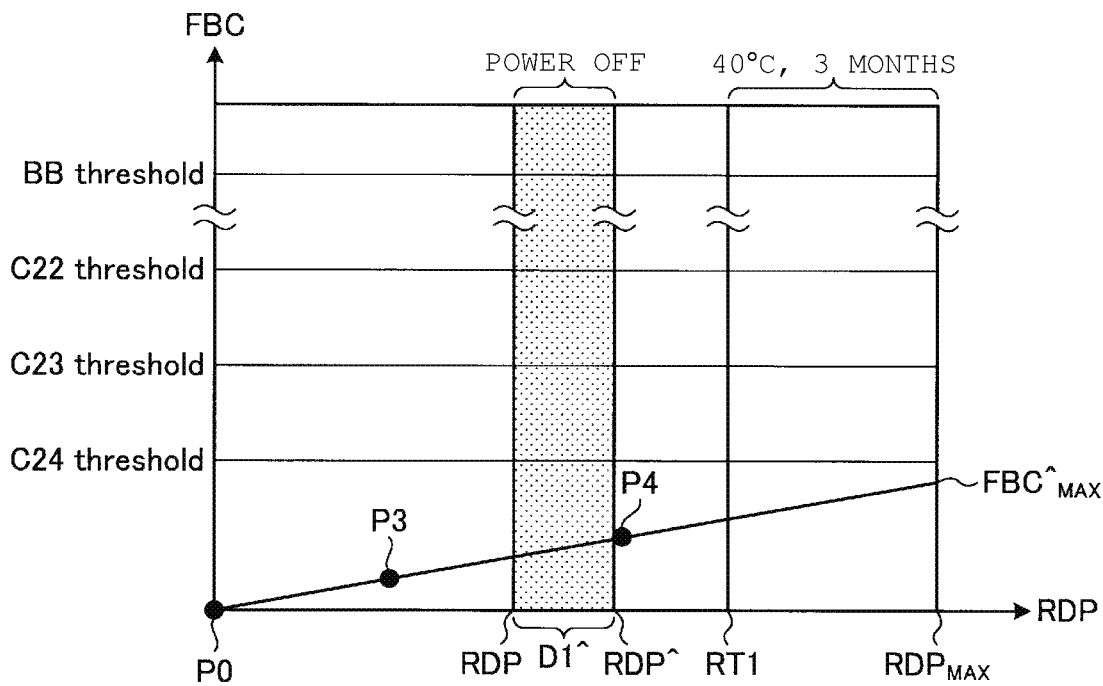
FIG. 16 is a graph illustrating a third processing example according to the embodiment.

FIG. 16 is a graph illustrating a third processing example of the embodiment. In this third processing example, the RDP that has advanced with the power off is estimated. When the CPU 24 executes the FBC check operation (FIG. 13) at the timing before the power is turned off and the point corresponding to the values of RDP and FBC is a point P3, the CPU 24 calculates, for example, a linear or primary regression equation based on the point P0 as the origin of the graph and the point P3. When the FBC check is performed twice or more at the timing before the power is turned off, the CPU 24 can calculate a regression equation of a straight line or a curve based on three or more points including the origin of the graph. Further, the CPU 24 calculates the point P4 by executing the FBC check operation (FIG. 13) at the timing when the power-off is finished (that is, after the power is restored) and substituting the FBC value into the regression equation. The other processes are the same as those in FIGS. 14 and 15 and the descriptions thereof will be omitted. As a result, even if there is a period in which power is not supplied, the reliability of function guarantee at an environmental temperature of 40° C. for three months is improved.

$RDP\hat{}-RDP$ (i.e., last RDP calculated before power-off)=$D1\hat{}$ is obtained at a certain physical position (for example, a physical block or a block group) of the NAND memory 1, and added to the RDP at the other physical positions of the NAND memory 1, thereby, estimating $RDP\hat{}$ that has been advanced during the power-off. Further, $RDP\hat{}$ that has been advanced during the power-off may be estimated by adding $D1\hat{}$ obtained from the average of $RDP\hat{}$ obtained at a plurality of locations to RDP at other locations.

Figure 17:
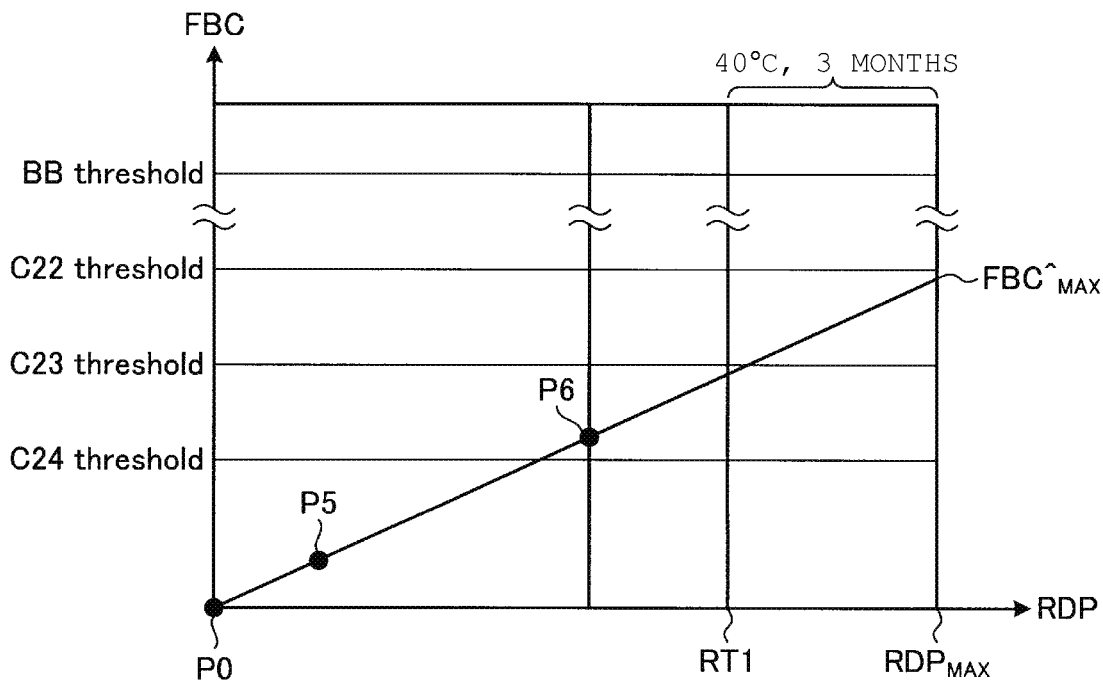
FIG. 17 is a graph illustrating a fourth processing example according to the embodiment.

FIG. 17 is a graph illustrating a fourth processing example according to the embodiment. When the CPU 24 executes the FBC check operation (FIG. 13) at any timing and the point corresponding to the values of RDP and FBC is a point P5, the CPU 24 calculates, for example, a linear or primary regression equation based on the point P0 as the origin of the graph and the point P5. As a result, the FBC is larger than the C24 threshold at the timing of the point P6 earlier than the refresh operation timing RT1. Even in that case, the CPU 24 can check the FBC when the correction is successful by the L3 correction or the L4 correction at the timing when the FBC exceeds the C24 threshold.

Then, the CPU 24 performs the refresh operation preferentially and performs a process of changing the coding rate of the address. In this case, since C22 threshold is larger than $FBC\hat{}_{Max}$, the CPU 24 selects C22 as the coding rate type. As a result, the possibility that the L1 correction cannot be performed can be reduced.

FIG. 18 is a table showing main parameters used in the memory system 100 of the embodiment. These parameters are stored, for example, in a block management table (not illustrated). In this table, attributes, parameters, and contents are indicated in order from the left.

The parameters of Blk0 and Blk1 have an attribute of Block addr (block address) and indicate the physical block number indicated by the block management table as the content. In this table, the parameters described below are shared by Blk0 and Blk1. The block address is not limited to two. Further, not only the block address but also the page may be managed.

The parameters of Ref Thresh and RDP_cur have an attribute of Refresh info (refresh operation information), and indicate the threshold value of the refresh operation and the current value of RDP as contents.

The parameters of a and b have an attribute of regression expression (for example, y=ax+b), and indicate coefficients of the regression equation as contents. The coefficient to be managed is not limited to two.

The parameters of CR_cur and CR_next have an attribute of Code Rate (code rate: coding rate), and indicate the current value and the next value of the coding rate as contents. When changing the coding rate, the next coding rate may be written in CR_next.

The parameters of FBC_1 and RDP_1 have an attribute of Sample Data (sample data), and indicate examples of values of FBC and RDP (RDP when FBC is acquired) as contents.

The parameters of FBC_2 and RDP_2 have an attribute of Sample Data (sample data), and indicate examples of values of FBC and RDP (RDP when FBC is acquired) as contents.

When reconstructing a logical block, a logical block can be constructed by blocks having close values of a (i.e., slope when the regression line is a straight line) indicating the ease of increasing RDP, or conversely, the value of a can be scattered not to be close.

As described above, according to the memory system 100 of the present embodiment, a trend of the temporal change in the bit error rate is obtained for each block of the NAND memory 1, and an appropriate timing for the refresh operation can be determined for the set error correction performance based on the trend.

Further, by setting the coding rate of the variable length code assigned to the data based on the trend, for example, the possibility that the L1 correction will fail can be reduced. Further, it is possible to avoid a situation in which a coding rate with a correction performance higher than necessary before the situation occurs.

Also, by setting the coding rate type (e.g., C24 to C18) and the refresh operation timing according to the ease of fluctuation of the memory cell potential for each block, the possibility of L1 correction failure is reduced. For example, the reliability of the function guarantee when the environmental temperature is left at 40° C. for 3 months without supplying the power is improved.

In the comparative example, for example, when the L1 correction fails, a process of increasing the L1 correction capability by one level, such as changing the coding rate from C24 to C23, is performed. However, the L1 correction capability may not be sufficient only by raising one level. According to the method of the present embodiment, as can be understood from the example of FIG. 17, when the L1 correction fails in C24, it is understood that it is necessary to change to C22 instead of C23, and the coding rate can be changed to C22. Thus, the drawbacks of the comparative example as described above are eliminated. In addition, according to the method of the present embodiment, when the L correction fails, if correction is not possible even when the L1 correction capability is maximized, since it is easily understood that the correction cannot be performed by the L1 correction and higher level correction is required, an efficient response can be made.

In addition, since the L3 correction execution frequency is reduced, the latency or delay time is alleviated and the occurrence rate of uncorrectable errors is reduced.

In addition, by calculating a regression equation relating to the passage of time and the change of the index value (i.e., RDP), the index value after returning from power-off can be estimated.

Further, based on the addition value table, the index value (i.e., RDP) can be appropriately increased according to the temperature of the NAND memory 1 and the number of times of writing/erasing. Therefore, the timing of the refresh operation can be advanced as the address tends to deteriorate.

Further, when calculating the bit error rate, a more accurate value can be calculated by calculating the bit error rate based on the read result obtained by the Vth tracking and the result of RS correction of the data.

In addition, the index value can be appropriately managed by resetting the index value corresponding to the block subjected to the refresh operation to 0.

In another embodiment, with respect to the parameters illustrated in FIG. 18, when erasing, Sample Data (sample data) and coefficients of the regression equation may be reset. However, since the tendency of deterioration does not change greatly after erasing, the past regression equation may be used continuously.

Further, for example, iterative correction combining the L1 correction to the L3 correction, and the L4 correction may be performed. Specifically, in the iterative correction, for example, when there are not enough symbols necessary for the L4 correction, the L4 correction may be performed again after collecting the insufficient symbols by correction using the above-described LDPC code or the like. The symbol represents a correction frame used in the L4 correction in which the L1 correction has been successful.

In the above-described embodiment, the floating gate type memory cell has been described. However, the present disclosure is not limited thereto. For example, a memory cell of another type such as a charge trap type may be used.

Further, the addition value table illustrated in FIG. 9 may be used as a subtraction value table. In this case, a subtraction value "RD" equivalent to the addition value table of FIG. 9 is stored in the subtraction value table. The index value "RDP" has an initial value that is equal to or less than a threshold value for the current coding rate type, for example, and the regression equation may be a function that has a negative slope and decreases with the passage of time. Thus, the timing when the index value "RDP" becomes 0 or less may be set as the refresh operation timing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile semiconductor memory having a plurality of blocks each including a plurality of memory cells; and
a memory controller configured to:
calculate a number of error bits when reading data from a block among the blocks and a variable value that is dependent on a total number of writes or erases performed on the block and a temperature of the semiconductor memory, and derive an equation representing changes in the number of error bits for the block as a function of variable values, and
based on the derived equation, determine, for the block, a threshold value for the variable value, wherein a next refresh operation by which data that have been written to the block are rewritten, is performed when the calculated variable value reaches the determined threshold value.

2. The memory system according to claim 1, wherein the memory controller is configured to calculate the number of error bits when any error in reading the data is correctable.

3. The memory system according to claim 2, wherein the memory controller is configured to perform a Vth tracking read to read the data from the block.

4. The memory system according to claim 3, wherein the memory controller is configured to, in the Vth tracking read, read the data from the memory cells of the block by applying a read voltage thereto,
the read voltage being determined by a tracking operation for searching for a minimum point in a potential distribution of the memory cells.

5. The memory system according to claim 3, wherein the memory controller is configured to, when an uncorrectable error occurs during the Vth tracking read, perform an RS (Reed-Solomon) read to read the data from the block, the RS read including reading data from other blocks.

6. The memory system according to claim 1, wherein the memory controller is configured to set a coding rate of a variable length code for error correction in the block based on the changes in the number of error bits for the block.

7. The memory system according to claim 1, wherein the memory controller is configured to:
store an addition value table of an addition value to be added to a calculated variable value according to the total number of writes or erases and the temperature of the semiconductor memory, and
periodically acquire the total number of writes or erases and the temperature and calculate a current variable value with the addition value.

8. The memory system according to claim 7, wherein the memory controller is configured to, when the refresh operation is performed for one of the blocks, reset the current variable value corresponding to the one of the blocks to 0.

9. A method performed in a memory system including a non-volatile semiconductor memory having a plurality of blocks each including a plurality of memory cells, the method comprising:
calculating a number of error bits when reading data from a block among the blocks and a variable value that is dependent on a total number of writes or erases performed on the block and a temperature of the semiconductor memory, and derive an equation representing changes in the number of error bits for the block as a function of variable values; and
based on the derived equation, determining, for the block, a threshold value for the variable value, wherein a next refresh operation by which data that have been written to the block are rewritten, is performed when the calculated variable value reaches the determined threshold value.

10. The method according to claim 9, wherein the number of error bits is calculated when any error in reading the data is correctable.

11. The method according to claim 10, wherein a Vth tracking read is performed to read the data from the block.

12. The method according to claim 11, wherein in the Vth tracking read, the data is read from the memory cells of the block using a read voltage determined by tracking operation for searching for a minimum point in a potential distribution of the memory cells.

13. The method according to claim 11, wherein when an uncorrectable error occurs during the Vth tracking read, an RS (Reed-Solomon) read is performed to read the data from the block, the RS read including reading data from other blocks.

14. The method according to claim 9, further comprising:
setting a coding rate of a variable length code for error correction in the block based on the changes in the number of error bits for the block.

15. The method according to claim 9, further comprising:
storing an addition value table of an addition value to be added to a calculated variable value according to the total number of writes or erases and the temperature of the semiconductor memory, wherein
the total number of writes or erases and the temperature are periodically acquired to calculate a current variable value with the addition value.

16. The method according to claim 15, further comprising:
when the refresh operation is performed for one of the blocks, resetting the current variable value corresponding to the one of the blocks to 0.

* * * * *